(12) United States Patent
Sato

(10) Patent No.: US 8,456,741 B2
(45) Date of Patent: Jun. 4, 2013

(54) OPTICAL MODULE HAVING THREE OR MORE OPTICALLY TRANSPARENT LAYERS

(75) Inventor: Kenji Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 351 days.

(21) Appl. No.: 12/973,320

(22) Filed: Dec. 20, 2010

(65) Prior Publication Data

US 2011/0085240 A1    Apr. 14, 2011

Related U.S. Application Data

(62) Division of application No. 12/320,782, filed on Feb. 4, 2009, now Pat. No. 7,944,613, which is a division of application No. 10/539,290, filed as application No. PCT/JP03/16022 on Dec. 15, 2003, now Pat. No. 7,495,832.

(30) Foreign Application Priority Data

Dec. 17, 2002    (JP) .................................. 2002-365101

(51) Int. Cl.
*G02B 5/28*    (2006.01)

(52) U.S. Cl.
USPC .......... 359/589; 359/588; 359/337.5; 398/81; 398/149

(58) Field of Classification Search
None
See application file for complete search history.

(56) References Cited

U.S. PATENT DOCUMENTS

| | | | |
|---|---|---|---|
| 4,811,404 A | 3/1989 | Vilmur et al. | |
| 5,012,519 A | 4/1991 | Adlersberg et al. | |
| 5,238,738 A | 8/1993 | Miller | |
| 5,243,610 A | 9/1993 | Murata | |
| 5,293,548 A | 3/1994 | Siebert | |
| 5,557,468 A * | 9/1996 | Ip .................................. | 359/615 |
| 5,717,510 A | 2/1998 | Ishikawa et al. | |
| 5,757,937 A | 5/1998 | Itoh et al. | |
| 6,275,315 B1 | 8/2001 | Park et al. | |
| 6,396,617 B1 | 5/2002 | Scalora | |
| 6,570,691 B1 | 5/2003 | Miyauchi et al. | |

(Continued)

FOREIGN PATENT DOCUMENTS

| | | |
|---|---|---|
| EP | 0 562 828 A1 | 9/1993 |
| EP | 1 104 925 A1 | 6/2001 |

(Continued)

OTHER PUBLICATIONS

Kenji Sato, USPTO Notice of Allowance, U.S. Appl. No. 12/320,782, filed Jan. 13, 2011, 7 pages.

(Continued)

*Primary Examiner* — Arnel C Lavarias
(74) *Attorney, Agent, or Firm* — Foley & Lardner LLP

(57) ABSTRACT

A light dispersion filter is composed of three or more optically transparent layers each having a value equal to the value of the product of the refractive index and thickness of the optically transparent layer and transmitted light, and a plurality of partially reflective layers arranged alternately with the optically transparent layers and having predetermined reflectivities. Alternatively, a light dispersion filter has a plurality of etalon resonators which are arranged in series such that the value of the product of the refractive index of air and the interval of the etalon resonators is equal to the value of the product of the refractive index and thickness of the optically transparent layers.

4 Claims, 9 Drawing Sheets

U.S. PATENT DOCUMENTS

| | | |
|---|---|---|
| 6,631,246 B2 | 10/2003 | Ford et al. |
| 7,495,832 B2 * | 2/2009 | Sato .............................. 359/589 |
| 7,944,613 B2 * | 5/2011 | Sato .............................. 359/589 |
| 2001/0021053 A1 | 9/2001 | Colbourne et al. |
| 2002/0064334 A1 | 5/2002 | Jablonski et al. |
| 2004/0070834 A1 | 4/2004 | Hendrix et al. |

FOREIGN PATENT DOCUMENTS

| | | |
|---|---|---|
| JP | 02-178635 | 7/1990 |
| JP | 4-263228 A | 9/1992 |
| JP | 05-323391 | 12/1993 |
| JP | 06-160604 | 6/1994 |
| JP | 09-113415 JP | 5/1997 |
| JP | 10-048567 | 2/1998 |
| JP | 10-242910 | 9/1998 |
| JP | 2000-105313 | 9/1998 |
| JP | 11-136186 A | 5/1999 |
| JP | 2000-105313 A | 4/2000 |
| JP | 2000-235170 A | 8/2000 |
| JP | 2000-252920 | 9/2000 |
| JP | 2001-42232 A | 2/2001 |
| JP | 2001-215325 | 8/2001 |
| JP | 2001-251004 A | 9/2001 |
| JP | 2001-251246 A | 9/2001 |
| JP | 2001-305339 | 10/2001 |
| JP | 2002-082220 A | 3/2002 |
| JP | 2002-122732 | 4/2002 |
| JP | 2002-243935 A | 8/2002 |
| JP | 2003-264505 A | 9/2003 |
| JP | 2003-344646 A | 12/2003 |
| JP | 2004-093620 A | 3/2004 |
| WO | WO 98/35259 | 8/1998 |
| WO | WO 00/22444 | 4/2000 |
| WO | WO 00/48171 A1 | 8/2000 |
| WO | WO 01/86328 A1 | 11/2001 |

OTHER PUBLICATIONS

Dowling, E. M., et al., "Lightwave Lattice Filters for Optically Multiplexed Communication Systems", J. Light. Technol., vol. 12, No. 3, pp. 471-486 (1994).

Lenz, G., et al., "Dispersive Properties of Optical Filters for WDM Systems", IEEE J. Quantum Elect., vol. 34, No. 8, pp. 1390-1402 (1998).

Moss, D. J., "Multichannel tunable dispersion compensation using all-pass multicavity etalons", OFC, Uniphase Corp., Ottawa, Ont. Canada, pp. 132-133 (2002).

* cited by examiner

OPTICAL MODULE HAVING THREE OR MORE OPTICALLY TRANSPARENT LAYERS

CROSS-REFERENCE TO RELATED PATENT APPLICATIONS

This application is a division of application Ser. No. 12/320,782, filed Feb. 4, 2009, which is a division of application Ser. No. 10/539,290, filed Jun. 16, 2005, now U.S. Pat. No. 7,495,832, issued Feb. 24, 2009, which is a National stage of PCT/JP2003/016022, filed Dec. 15, 2003, which claims the benefit of priority to Japanese Patent Application No. 2002-365101, filed Dec. 17, 2002, all of which are incorporated herein by reference in their entirety. This application claims only subject matter disclosed in the parent applications and therefore presents no new matter.

TECHNICAL FIELD

The present invention relates to a light dispersion filter for applying desired dispersive properties to incident light and that has characteristics that a group delay amount varies depending on a light wavelength.

BACKGROUND ART

In an optical communication system which employs optical fibers for transmitting optical signals, it is known that optical signals disperse within optical fibers are effected by disturbed signal waveforms, resulting in limited transmission distances. The dispersion is a phenomenon attributable to a difference in the diffractive index from one wavelength to another within an optical fiber that cause signals to arrive at different timings. Since an optical signal generally has a predetermined spectral width, a long transmission distance would cause its signal wave to extend on a time axis due to the dispersion, resulting in a failure to correctly receive information on the receiver side.

In basic networks, access networks and the like, light sources in a 1.55 μm band are used because losses are generally minimized in this band within an optical fiber. An optical signal within this wavelength band receives a dispersion value of approximately 17 ps/nm/km within an optical fiber. Therefore, the influence of the dispersion can be alleviated during optical transmissions if the dispersive properties of optical fibers are shifted such that a dispersion value is minimized for optical signals within the 1.55 μm wavelength band. An optical fiber, the dispersive properties of which are shifted from a predetermined wavelength band, is called a "dispersion shift fiber" (DFS).

However, since the dispersion shift fiber has a complicated refractive index distribution in a cross-sectional direction as compared with an ordinary optical fiber, the dispersive properties are directly affected by distorted cores due to routing during the installation of optical fibers, so that dispersion values vary depending on positions of optical fibers. Also, the dispersion values largely fluctuate due to changes in the ambient temperature. For these reasons, in conventional optical communication systems which employ dispersion shift fibers, overall transmission paths are designed in detail in a distributive strategy, but an increase in the distance and capacity of the transmission path has been impeded by higher cost of the dispersion shift fibers which are manufactured based on the result of this design.

Generally, within an optical fiber, the product of the square of a transmission speed and a dispersion value of an optical signal is constant. Therefore, if an optical signal has a spectral width, a transmittable distance is reduced in reciprocal proportion to the square of the speed.

For example, when a directly modulated semiconductor laser is used as a light source, the dispersion exerts a large influence because of large fluctuations in the wavelength of the light source. On the other hand, when an externally modulated semiconductor laser is used as a light source, fluctuations in the wavelength can be limited by adjusting an external modulator of Mach-Zehnder type, so that a transmission speed can be realized in a range of 10 to 40 Gb/s. However, even in this situation, the influence of the dispersion cannot be eliminated.

Therefore, optical communication systems generally employ an approach of increasing a transmission distance by reducing the influence exerted by the dispersion with the provision of a dispersion compensator disposed on the light source side or light receiver side for giving a dispersion which has properties opposite to those of dispersion given by optical signals within optical fibers.

As an example of providing such a dispersion compensator, a configuration which comprises a dispersion compensator in a transmission unit (light source side) is disclosed in Patent Document 1 (JP-10-242910-A). Also, as a specific configuration of a dispersion compensator, Patent document 2 (JP-5-181028-A) and Patent document 3 (JP-5-323391-A) each describe a dispersion compensator of a fiber ring resonator type. Further, a dispersion compensator of a fiber grating resonator type described in Patent document 4 (JP-2000-252920-A), a dispersion compensator of a multiple reflection delay plate type described in Patent document 5 (Published Japanese Translation of PCT International Publication for Patent Application No. 2000-511655), and the like are known as well.

Since these dispersion compensators employ a large scale configuration in order to compensate for the dispersion, the problem of an increase in the cost of the optical communication system will occur. Nevertheless, these dispersion compensators are suitable for use in optical communication systems for long distance transmissions because they are capable of compensating for a large amount of dispersion (for example, 3000 ps/nm).

On the other hand, as an attempt to reduce the size of the dispersion compensator, Patent Document 6 (JP-6-160604-A), for example, describes a dispersion compensator which utilizes an etalon resonator (hereinafter called the "etalon type dispersion compensator"). In the following, this etalon type dispersion compensator will be briefly described.

The etalon resonator includes two partially transmitting mirrors (partially reflective layers) arranged with a predetermined spacing therebetween to form a reflection type resonator, wherein peaks appear in the transmission property of light at intervals of a predetermined frequency called "FSR" (Free Spectral range). FSR is a frequency determined by the spacing interposed between the arranged partially transmitting mirrors. For example, in a configuration comprising an optically transparent layer having a refractive index of 1.5, such as glass, and sandwiched by partially transmitting mirrors, FSR is calculated to be approximately 100 GHz when the spacing between the partially transmitting mirrors is 1 millimeter.

Incident light on the etalon resonator is transmitted through the resonator while repeating reflections between both end faces of the two partially transmitting mirrors. In this event, while wavelength light having more transparent components and wavelength light having less transparent components can be observed, any wavelength light reflects on the end faces at an equal rate, so that it is thought that wavelength light having more transparent components reciprocates a larger number of times and is therefore transmitted through the etalon resonator with a larger delay. In other words, the dependency of the transmission property on the wavelength means that a difference is produced in the delay time depending on the wavelength. The etalon resonator can be used as a light dispersion filter having large dispersive properties because its delay time largely varies in response to fluctuations in the wavelength. Among the dispersive properties of the etalon resonator, if part of the properties opposite to the dispersive properties of an optical fiber is utilized to give dispersion to an optical signal which enters into the optical fiber or an optical signal delivered after transmission in the optical fiber, it is possible to reduce the influence of the dispersion given by the optical fiber.

For the etalon type dispersion compensator, there is also known a reflection type configuration which completely reflects light on one end face. When one end face is made to be completely reflective, light which should otherwise exit through the end face again passes along the etalon back to the incident side, so that the incident light is emitted from the same plane as the incident plane without loss. The amount of dispersion experienced by the emitted light is the sum of the amount of dispersion of the light which would otherwise be reflected, and the amount of dispersion of the light which would otherwise exit through the end face.

Since the etalon type dispersion compensator provides a substantially equal transmission property at every predetermined frequency interval (FSR), it can be used as a dispersion compensator for simultaneously compensating optical signals on multiple channels for dispersion, as in an optical wavelength division multiplexing (WDM).

However, conventional etalon type dispersion compensators can merely accomplish a dispersion compensation value of approximately 20 ps/nm, and the light dispersion filter has a transmittance of lower than 100%, thus causing an increase in the loss of optical power.

On the other hand, Patent Document 7 (JP-2000-105313-A) proposes a method to increase a dispersion compensation value by using a plurality of resonator type filters and expanding the bandwidth. Patent Document 7 describes that the dispersive properties are improved by stacking three layers of resonator filters each including a dielectric multi-layer film having predetermined dispersive properties.

However, the configuration described in Patent Document 7 employs a reflection type structure having a light incident plane, which also serves as an exit plane, in order to extract 100% of optical power while compensating for the dispersion, so that a device (circulator) is required for changing the optical path of incident light or emitted light. This requirement results in a large configuration of the device on the light source side or light receiver side which has the dispersion compensator, thus making the configuration unsuitable for a reduction in size. Further, since only dispersion is compensated for within a predetermined band, this configuration is not suited for multi-channel applications such as the etalon type dispersion compensator described in Patent Document 6.

Thus, Non-Patent Document 1 (Moss Optical Fiber Conference, 2002 Institute preprint manuscripts, TuT2, p 133, FIG. 1) describes an exemplary modification to the configuration described in Patent Document 7 for multi-channel applications. However, since the configuration described in Non-Patent Document 1 is a reflection type, i.e., having a light incident plane which also serves as an exit plane, similar to Patent Document 7, it requires a circulator and the like, and is therefore not suited for enabling size reduction. Further, an increased number of parts, required for a mechanism for varying the amount of dispersion, make the configuration complicated.

Patent Document 8 (Published U.S. Patent Application No. 2001-0021053) describes an exemplary configuration which is a similar configuration to Non-Patent Document 1 but does not employ a circulator. However, the configuration described in Patent Document 8 also has a problem similar to Non-Patent Document 1, and includes the difficulty of having an optical communication system and an optical system that have an increased size.

Problems of the conventional light dispersion filters described above may be summarized as follows:

A first problem is that the system configuration becomes large in an optical communication system which has a conventional dispersion compensator installed on the light source side or on receiver side.

This is because an optical path must be made sufficiently long in order to delay an optical signal for purposes of accomplishing a large dispersion compensation value because the dispersion compensation necessitates the creation of a delay circuit corresponding to a wavelength component.

A second problem is that optical power is lost without any benefit in the conventional dispersion compensators.

This is because a light coupling loss occurs when an optical signal is extracted from an optical fiber for performing the dispersion compensation and the optical signal is again returned into the optical fiber.

A third problem is that a dispersion compensation value is small in the conventional etalon type light dispersion filter.

This is because the conventional etalon type dispersion compensator cannot increase the dispersion compensation value due to a short path for delaying light.

A fourth problem is that the system scale is large due to a complicated optical system in the conventional optical communication system which comprises a reflection type dispersion compensator.

This is because parts for switching optical paths are required since the reflective dispersion compensator has a light incident plane which also serves as an exit plane.

DISCLOSURE OF THE INVENTION

It is therefore an object of the present invention to provide a light dispersion filter which is capable of serving as a dispersion compensator for accomplishing a longer transmission path while achieving a reduction in size, power consumption and cost.

It is another object of the present invention to provide a light dispersion filter which can be applied to a wide variety of pertinent technologies such as light dispersion measuring devices and the like, not limited to optical communications.

To achieve the above objects, a light dispersion filter according to the present invention comprises three or more optically transparent layers each having a value equal to the value of the product of a refractive index and a thickness of the optically transparent layer, and transmitted light, and a plurality of partially reflective layers each having a predetermined reflectivity, and arranged alternately with the optically transparent layers.

Alternatively, a light dispersion filter comprises a plurality of etalon resonators, each of which includes an optically transparent layer having a value equal to the value of the product of a refractive index and a thickness of the optically transparent layer, and transmitted light, and partially reflective layers having predetermined reflectivities, and bonded to two surfaces of the optically transparent layer, respectively, wherein the etalon resonators are arranged in series such that the value of the product of the refractive index of air and an interval of the etalon resonators is the value equal to the value of the product of the refractive index and thickness of the optically transparent layer.

In such configurations, since an effective optical path can be made longer, a transmission time difference (dispersion) due to the wavelength can be made larger. It is therefore possible to provide a dispersion compensator which, though small in size, exhibits a large dispersion compensation value.

Also, in the light dispersion filter according to the present invention, since similar transmission properties can be repeatedly presented at predetermined frequency intervals (FSR) depending on the thickness of the optically transparent layer (the length of the resonator), the dispersion can be simultaneously compensated for in a plurality of optical signals at equal communication channel intervals, as in a WDM communication system, if FSR is set equal to the communication channel interval.

On the other hand, an optical module according to the present invention comprises a transmission type light dispersion filter disposed on an optical axis, which connects an optical active element to an optical fiber, for compensating for dispersion given in the optical fiber.

Alternatively, an optical module comprises a reflection type light dispersion filter for compensating for dispersion given in an optical fiber, and comprises an optical active element, for use in optical communications, disposed at a location deviated from an optical axis which connects the optical fiber to the light dispersion filter.

In such configurations, since desired dispersive properties can be given to an optical signal using the light dispersion filter on the optical signal transmitter side or receiver side, a transmission distance can be extended in an optical communication system using optical fibers, without installing a large-scaled dispersion compensator external to the optical module. It is therefore possible to reduce the size and cost of the optical communication system.

Also, by containing the light dispersion filter, which serves as a light dispersion compensator, in the optical module on the optical signal transmitter side or receiver side, optical coupling loss can be minimized, without losing the optical power without any benefit, as is the case with a conventional dispersion compensator.

Particularly, in an optical module which comprises a reflection type light dispersion filter, since an optical active element is disposed at a location deviated from an optical axis which connects an optical fiber to a light dispersion filter, a circulator and the like are not required, so that an optical system can be simplified in configuration, thus preventing an increase in the size of the optical communication system.

BEST MODE FOR CARRYING OUT THE INVENTION

Figure 1:
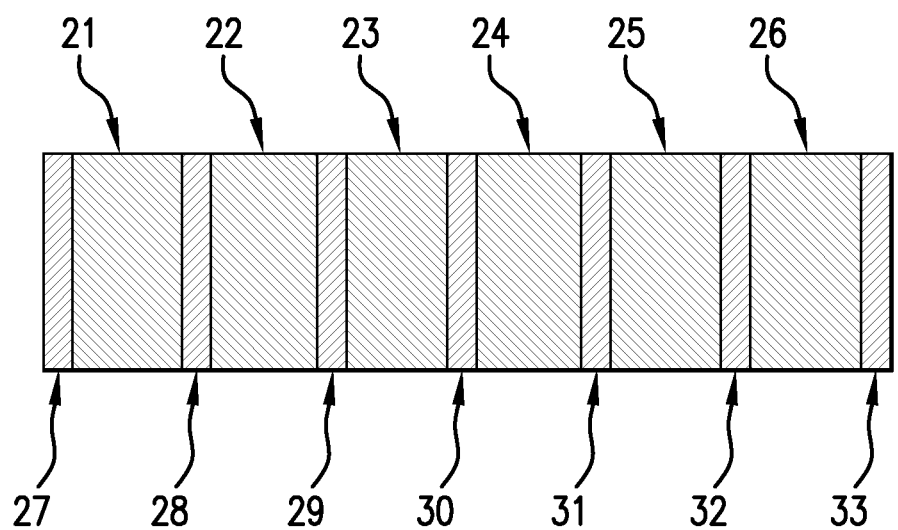
FIG. 1 is a cross-sectional view illustrating the configuration of a first embodiment of a light dispersion filter according to the present invention.

First, a description will be given of a light dispersion filter, according to the present invention, which is employed in a dispersion compensator, optical modules, a light dispersion measuring device, a communication channel extracting apparatus and the like, later described.

The aforementioned etalon resonator serves as a light dispersion filter which has an equal transmission property at every FSR interval. Within the etalon resonator, since incident light is transmitted therethrough after it has reciprocated between partially reflective layers a large number of times, the etalon resonator has a long effective optical path, though small in size, and can therefore increase a wavelength-based transmission time difference (dispersion). A single etalon resonator may be used to compensate for dispersion, like a conventional dispersion compensator, but according to the calculation made by the inventors, the resulting dispersion compensation value is as small as 20 ps/nm at maximum when an etalon resonator with FSR=100 GHz is used in a 20 GHz frequency band.

In the present invention, a plurality of etalon resonators are adhered to each other to make up a light dispersion filter, thereby further increasing an effective optical path of incident light. In this way, the dispersion compensation value can be further increased. However, simple adhesion of etalon resonators cannot result in constant dispersive properties over a wide band. This is because there is a close relationship between the dispersive properties for the wavelength and the reflectivity between the respective etalon resonators.

In the present invention, the reflectivity is varied on each of the boundary planes between a plurality of etalon resonators, and the highest reflectivity is set on a boundary plane near the center in the direction of thickness of the light dispersion filter, while the reflectivity on the respective boundary planes is set to be gradually lower toward both end faces when a transmission type light dispersion filter is configured. On the other hand, when a reflection type light dispersion filter is configured, the lowest reflectivity is set on an incident plane, the reflectivity is set to 100% on the last end face on the opposite side to the incident plane, and the reflectivity on the respective boundary planes is set to be gradually higher from the incident plane to the last end face. By thus setting the reflectivity on each boundary plane, desired dispersive properties can be provided by the entirety of the plurality of etalon resonators.

Incidentally, for designing a light dispersion filter, an extreme of the light dispersion filter is generally designed to a desired value. For example, as described in Lenz, "Dispersive Properties of Optical Filters for WDM Systems," IEEE Journal of Quantum Electronics, 1998, No. 34, vol 8, pp. 1390-1402, since one etalon resonator has one extreme, a multi-layered etalon resonator, as in the present invention, will have a transmission property which includes extremes of the respective etalon resonators superimposed thereon.

In the light dispersion filter according to the present invention, the amount of dispersion is calculated by differentiating a group delay time found from the superimposed extremes that are determined by the respective etalon resonators with respect to the wavelength. Also, in order to ensure constant dispersive properties within an operating band (generally in a band corresponding to one-half period of FSR), the amount of dispersion is determined such that a group delay characteristic is linear in the band corresponding to one-half period of FSR. A general designing method therefor is shown, for example, in JP-2002-122732-A. According to this official bulletin, a configuration having three or more extremes can provide a linear group delay characteristic in the band corresponding to one-half of FSR, and a larger slope (i.e., dispersion value) can be set for the group delay characteristic as the number of layers is increased. Therefore, the light dispersion filter according to the present invention is preferably composed of three or more layers of etalon resonators.

The aforementioned JP-2002-122732-A describes in detail a reflection type dispersion compensator using an etalon resonator. Therefore, in a dispersion compensator which utilizes an etalon resonator, it is known that its extreme (frequency at which the transmission property reaches a peak) is set to a desired value. However, the light dispersion filter according to the present invention differs from the aforementioned official bulletin in how values are set for the extremes.

In the present invention, extremes are set in the following manner for forming a transmission type light dispersion filter. A light dispersion filter composed of three layers of etalon resonators will be given as an example for the following description.

As mentioned above, the transmission property of each etalon resonator depends on a respective extreme. Assume herein that respective extremes are represented by p1, p2, p3, and p1, p2, p3 are determined such that constant dispersive properties are derived in a band corresponding to one-half period of FSR.

Since the denominator of the transmission property of each etalon resonator is determined from the extreme, the denominator is proportional to:

$$(1-p1/z)\cdot(1-p2/z)\cdot(1-p3/z) \tag{1}$$

where z is a propagation constant for one round trip of incident light within the etalon resonator.

Assume also that the reflectivities on respective boundary planes of three layers of etalon resonators (a first etalon resonator to a third etalon resonator) are represented by r0, r1, r2, r3, where r0 is the reflectivity on a boundary plane between the first etalon resonator and air; r1 on a boundary plane between the first etalon resonator and the second etalon resonator; r2 on a boundary plane between the second etalon resonator and the third etalon resonator; and r3 on a boundary plane between the third etalon resonator and air.

In this event, according to Equation 35 in Dowling, "Lightwave Lattice Filters for Optically Multiplexed Communication Systems," IEEE Journal of Quantum Electronics, 1994, No. 12, vol. 3, pp. 471-486, the denominator of the transmission properties of the etalon resonators is proportional to:

$$r0\cdot r3/z^3 + (r0\cdot r2 + r1\cdot r3 + r0\cdot r1\cdot r2\cdot r3)/z^2 + (r0\cdot r1 + r1\cdot r2 + r2\cdot r3)/z + 1 \tag{2}$$

Equation (1) expresses the transmission properties derived from the extremes, while Equation (2) expresses the transmission properties derived from the reflectivities on the respective boundary planes, and these denominators must be matched in form. Therefore, the configuration can be determined for a light dispersion filter used in the present invention if r0-r3 are determined such that the coefficient z is equal in Equation (1) and Equation (2).

While the number of conditions derived from the foregoing comparison of the coefficient is the same as the number of layers of the etalon resonators, there are a number of reflectivities larger by one value than the number of planes of the etalon resonators, i.e., the number of conditions. Therefore, for r0-r3, when a value is arbitrary determined for a single one (r0 or r1 or r2 or r3), values are determined for the remaining ones. For example, when $p1=0.1\times e^{i\pi/6}$, $p2=0.1\times e^{-i\pi/6}$, $p3=0.25$, if $r0=0.1\%$ is determined, this results in $r1=2\%$, $r2=80\%$, and $r3=10\%$. Here, when r0 is set at a value close to nonreflection, it is understood that r1-r3 are such that the highest reflectivity is found on a boundary plane at the center of the light dispersion filter in the direction of thickness of the light dispersion filter, and the reflectivity becomes lower on boundary planes closer to both end faces. Note that the boundary plane on which the reflectivity is the highest is not always located at the center of the light dispersion filter, but may slightly move back and forth depending on the value of r0. Even when there are three or more layers of etalon resonators, the respective reflectivities can be found by comparing coefficients in the denominators of the transmission properties in a similar manner.

Further, for a reflection type light dispersion filter, the reflectivities are determined on respective boundary planes by comparing coefficients between the transmission properties derived from extremes and the transmission properties derived from the reflectivities in a manner similar to the transmission type. In the reflection type light dispersion filter, the lowest reflectivity is set on an incident plane, the reflectivity is set at 100% on the last end face on the opposite side to the incident plane, and the reflectivity becomes gradually higher on respective boundary planes from the incident plane to the last end face.

The light dispersion filter according to the present invention employs a multi-layered film composed of thin dielectric films as partially reflective layers of the respective etalon resonators, and sandwiches the multi-layered film by substrates (optically transparent layers) made of glass, semiconductor or the like. Here, in regard to the fabrication of a transmission type light dispersion filter, the transmission power has a periodic property with respect to the frequency, like dispersive properties, so that the waveform of optical signals is likely to be distorted. Therefore, the transmission power property of the multi-layered film preferably has the least possible dependence on the frequency (dependency on the wavelength). As described above, in the present invention, the reflectivity of an arbitrary boundary plane in a plurality of etalon resonators can be set to a desired value, so that the reflectivity can be set higher on the light incident plane. In this event, because of the ability to reduce the optical power which returns from the exit plane side of the light dispersion filter, the frequency dependency can be reduced for the dispersive properties of light which is finally transmitted through the light dispersion filter. For reference, when the reflectivity of light on the incident plane is set to 50% or higher, this effect appears prominent. When the reflectivity of light on the incident plane is set relatively high, the reflectivity gradually decreases on the respective boundary planes of the light dispersion filter according to the present invention from the incident plane to the exit plane. Alternatively, the reflectivity increases, one time, after it decreases from the incident plane to the exit plane, and subsequently decreases again toward the exit plane.

The light dispersion filter according to the present invention can further increase a dispersion compensation value, and can also extend the operating band as the number of layers of the etalon resonators is increased. However, an increase in the number of layers of the etalon resonators causes a reduction in the light transmission power due to an increased number of reflective surfaces. While the number of layers of the etalon resonators is thought to be approximately 20 at maximum, an optimal number of layers may be selected in consideration of the amount of attenuated transmission power and required dispersion properties.

For the light dispersion filter according to the present invention, the reflectivity is calculated for each of the boundary planes of the etalon resonators using the aforementioned Equations (1), (2), but the reflectivity of each boundary plane need not be strictly matched to the calculated value. An error of approximately ±10% with respect to a calculated value is within an allowable range, and the transmission property will not significantly lose its shape as long as the relationship among the reflectivities of the respective boundary planes satisfies the aforementioned conditions.

Also, the light dispersion filter according to the present invention can employ an air layer instead of the substrate. However, since the respective etalon resonators must exhibit equal FSR, the product of the reflectivity and thickness of the material (substrate or air) of each substrate should be set substantially equal. Here, while the product of the reflectivity and thickness of each medium is preferably equal, strict equality is not required. For example, assuming that each substrate has a thickness of 1 mm, errors of several to several tens of microns will not affect the transmission property.

Also, in the present invention, an adhesive (for example, an epoxy-based adhesive) is used as a method of bonding the respective etalon resonators. This adhesive preferably has the same refractive index as the substrate. The use of such an adhesive will eliminate reflection of light on the boundary between the adhesive and the substrate, so that even if the adhesive differs in thickness on the order of several microns from one substrate to another, FSR's corresponding to the thicknesses (on the order of millimeters) of the respective substrates become equal, thus causing no problem.

Also, the light dispersion filter according to the present invention may omit at least one multi-layered film which comprises the incident plane or exit plane. In this event, the reflectivity of the incident plane or exit plane is thought to be approximately 2% from the difference in the refractive index between the substrate and air.

Further, while the present invention employs a material such as a dielectric material, such as glass, semiconductor, or the like for the substrate which determines the length of the etalon resonator, a semiconductor substrate including an amplifier circuit may be employed to amplify an optical signal which is transmitted therethrough.

Next, embodiments of the present invention will be described with reference to the drawings.

First Embodiment

FIG. 1 is a cross-sectional view illustrating the configuration of a first embodiment of a light dispersion filter according to the present invention. While FIG. 1 illustrates an exemplary light dispersion filter composed of six layers of etalon resonators, the number of etalon resonators is not limited to six, but may be less than six (however, three or more) or more than six in accordance with desired dispersive properties and transmittance.

As illustrated in FIG. 1, the light dispersion filter of the first embodiment comprises an alternating arrangement of first substrate 21 to sixth substrate 26 and first multi-layered film 27 to seventh multi-layered film 33 which sandwich first substrate 21 to sixth substrate 26.

First substrate 21 to sixth substrate 26 and first multi-layered film 27 to seventh multi-layered film 33 are bonded to each other using an adhesive. The adhesive preferably has a refractive index close to that of first substrate 21 to sixth substrate 26 or first multi-layered film 27 to seventh multi-layered film 33.

First substrate 21 to six substrate 26 are each formed in a thickness of 1 mm such that FSR is 100 GHz, for example, using general glass which has the refractive index of 1.5.

First multi-layered film 27 to seventh multi-layered film 33 have light reflectivities having different values, respectively. When forming a transmission type light dispersion filter, in the light dispersion filter illustrated in FIG. 1, a higher reflectivity is set for a multi-layered film closer to a boundary plane near the center in the direction of thickness of the light dispersion filter (fourth multi-layered film 30 in FIG. 1), and lower reflectivities are set for multi-layered films closer to both end faces (first multi-layered film 27 and seventh multi-layered film 33 in FIG. 1).

On the other hand, when forming a reflection type light dispersion filter, the settings in the light dispersion filter illustrated in FIG. 1 are such that the multi-layered film on the incident plane (first multi-layered film 27 in FIG. 1) has the lowest reflectivity, and the reflectivity becomes gradually higher toward the multi-layered film (seventh multi-layered film 33 in FIG. 1) of the last end face on the opposite side of the incident plane.

Figure 2A:
FIG. 2A is a cross-sectional view illustrating an exemplary configuration of a single-layer thin film for use in a multi-layer film shown in FIG. 1.

As illustrated in FIG. 2A, when forming a transmission type light dispersion filter, first multi-layered film 27 and seventh multi-layered film 33 are &dined in a thickness which is one quarter of wavelength λ (=1.55 µm/refractive index 1.2) of transmitted light within the thin films, for example, by using a low-refractive index glass thin film (first thin film 40) having a refractive index of 1.2. In this embodiment, the reflectivity between air and first substrate 21 is set to 0% by first multi-layered film 27, while the reflectivity between air and seventh substrate 26 is set to 0% by seventh multi-layered film 33.

While this embodiment shows an example of forming first multi-layered film 27 and seventh multi-layered film 33 of single-layer thin films, it is also possible to employ low reflective films each composed of two or three layers of thin films. In this event, the thickness of each thin film layer is not limited to one quarter of wavelength λ of the transmitted light as long as low reflective film can be formed. In the transmission type light dispersion filter of this embodiment, since a higher light reflectivity is set for a multi-layered film closer to the central boundary plane, reflectivities of first multi-layered film 27 and seventh multi-layered film 33 need not be limited to 0% as long as they are not higher than the reflectivities of second multi-layer film 28 and sixth multi-layered film 32. For example, since the reflectivity is 2% on the interface of air and first substrate 21 or sixth substrate 26, first multi-layered film 27 and seventh multi-layered film 33 may be eliminated as long as the resulting light dispersion filter satisfies the aforementioned condition for the reflectivities.

On the other hand, when forming a reflection type light dispersion filter, the reflectivity is set, for example, to 0% for only first multi-layered film 27. However, the reflection type is similar to the transmission type in that the reflectivity of first multi-layered film 27 need not be limited to the foregoing value, and the multi-layered film may be composed of any number of layers as long as the resulting multi-layered film satisfies the condition for the reflectivities.

Figure 2B:
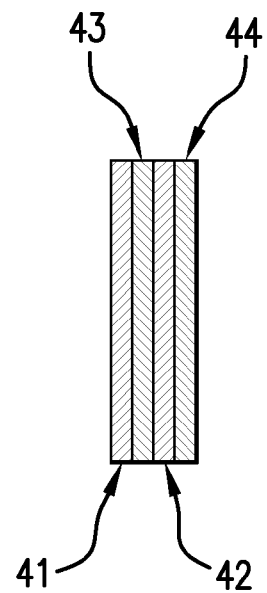
FIG. 2B is a cross-sectional view illustrating an exemplary configuration of a four-layer thin film for use in the multi-layer film shown in FIG. 1.

As illustrated in FIG. 2B, when forming a transmission type light dispersion filter, second multi-layered film 28 and sixth multi-layered film 32 are each formed of a laminate film composed, for example, of four layers of thin films (first thin film 41 to fourth thin film 44). Here, $SiO_2$ (silicon dioxide) having a refractive index of 1.5 is used for first thin film 41 and third thin film 42, while TiO (titanium oxide) having a refractive index of 2.8 is used for second thin film 43 and fourth thin film 44. With such a composition, the refractive index of second multi-layered film 28 and sixth multi-layered film 32 is set to 20%.

In this embodiment, the reflectivity of second multi-layered film 28 and sixth multi-layered film 32 are set to 20%, but since the light reflectivity is only required to be set higher for a multi-layered film closer to the boundary plane at the center of the light dispersion filter in the direction of thickness of the light dispersion filter, the reflectivity of second multi-layered film 28 and sixth multi-layered film 32 need not be limited to 20% as long as it is not higher than the reflectivity of third multi-layered film 29 and fifth multi-layered film 31. Also, second multi-layered film 28 and sixth multi-layered film 32 are not limited to four layers as long as they satisfy the aforementioned condition for the reflectivities. Further, the thickness of each thin film can also be freely designed as long as the resulting thin film satisfies the aforementioned condition for the reflectivities.

On the other hand, for forming a reflection type light dispersion filter, four layers of thin films, for example, are used to set the reflectivity of second multi-layered film 28 to 20%. The reflection type is similar to the transmission type in that the reflectivity of second multi-layered film 28 need not be limited to the foregoing value, and the multi-layered film may be composed of any number of layers as long as the resulting multi-layered film satisfies the aforementioned condition for the reflectivities.

Figure 2C:
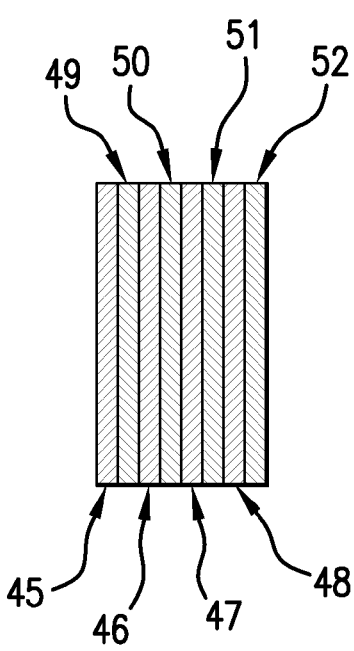
FIG. 2C is a cross-sectional view illustrating an exemplary configuration of an eight-layer thin film for use in the multi-layer film shown in FIG. 1.

As illustrated in FIG. 2C, when forming a transmission type light dispersion filter, third multi-layered film 29 and fifth multi-layered film 31 are each formed of a laminate film composed, for example, of eight layers of thin films (first thin film 45 to eighth thin film 52). Here, $SiO_2$ (silicon dioxide) having a refractive index of 1.5 is used for first thin film 45, third thin film 46, fifth thin film 47, and seventh thin film 48, while TiO (titanium oxide) having a refractive index of 2.8 is used for second thin film 49, fourth thin film 50, sixth thin film 51, and eighth thin film 52. With such a composition, the refractive index of third multi-layered film 29 and fifth multi-layered film 31 is set to 40%.

The reflectivity of third multi-layered film 29 and fifth multi-layered film 31 need not be limited to 40% as long as it is not higher than the reflectivity of fourth multi-layered film 30. Also, third multi-layered film 29 and fifth multi-layered film 31 are not limited to eight layers as long as they satisfy the aforementioned condition for the reflectivities. Further, the thickness of each thin film can also be freely designed as long as the resulting thin film satisfies the aforementioned condition for the reflectivities.

On the other hand, when forming a reflection type light dispersion filter, eight layers of thin films, for example, are used to set the reflectivity of third multi-layered film to 40%. The reflection type is similar to the transmission type in that the reflectivity of third multi-layered film 29 need not be limited to the foregoing value, and the multi-layered film may be composed of any number of layers as long as the resulting multi-layered film satisfies the aforementioned condition for the reflectivities.

Figure 2D:
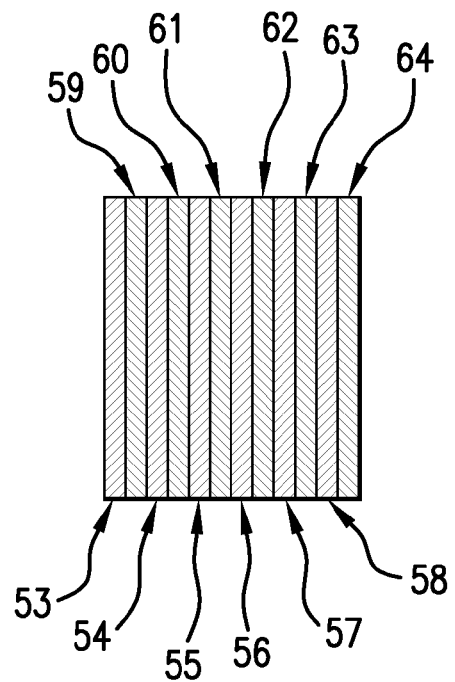
FIG. 2D is a cross-sectional view illustrating an exemplary configuration of a 12-layer thin film for use in the multi-layer film shown in FIG. 1.

As illustrated in FIG. 2D, fourth multi-layered film 30 is formed of a laminate film composed, for example, of 12 layers of thin films (first thin film 53 to twelfth thin film 64). Here, $SiO_2$ (silicon dioxide) having a refractive index of 1.5 is used for first thin film 53, third thin film 54, fifth thin film 55, seventh thin film 56, ninth thin film 57, and eleventh thin film 58, while TiO (titanium oxide) having a refractive index of 2.8 is used for second thin film 59, fourth thin film 60, sixth thin film 61, eighth thin film 62, tenth thin film 63, and twelfth thin film 64. With such a composition, the refractive index of fourth multi-layered film 30 is set to 80%.

In the configuration of the transmission type light dispersion filter of this embodiment, since fourth multi-layered film 30 is at the position of the central boundary plane, the reflectivity of fourth multi-layered film 30 need not be limited to 80% as long as the highest reflectivity can be set for fourth multi-layered film 30. Also, fourth multi-layered film 30 need not be limited to 12 layers as long as it satisfies the aforementioned condition for the reflectivities. Further, the thickness of each thin film can also be freely designed as long as the resulting thin film satisfies the aforementioned condition for the reflectivities.

On the other hand, for forming a reflection type light dispersion filter, a thin film of ten layers, for example, is used to set the reflectivity of fourth multi-layered film 30 to 50%. The reflection type is similar to the transmission type in that the reflectivity of fourth multi-layered film 30 need not be limited to the foregoing value, and the multi-layered film may be composed of any number of layers as long as the resulting multi-layered film satisfies the aforementioned condition for the reflectivities. For the reflective type, for example, ten layers of thin films are used to set the reflectivity of fifth multi-layered film 31 to 60%; 12 layers of thin films are used to set the reflectivity of sixth multi-layered film 32 to 80%; and 12 layers or more of thin films are used to set the reflectivity of seventh multi-layered film 33 to 100%. Likewise, these multi-layered films need not be limited in the number of layers as long as they satisfy the aforementioned condition for the reflectivities, and the thickness of each thin film can also be freely designed as long as the resulting thin film satisfies the aforementioned condition for the reflectivities.

In this embodiment, when a transmission type light dispersion filter is formed, the reflectivities exhibited by the multi-layered films are set to be symmetric about the central boundary plane of the light dispersion filter toward both end faces, but the symmetric configuration is not essential as long as the condition can be met for providing the highest reflectivity on the boundary plane near the center.

Also, while this embodiment has shown an example in which first substrate 21 to sixth substrate 26 are made of glass having the same refractive index, first substrate 21 to sixth substrate 26 may be made of different materials as long as they are composed such that the product of the refractive index and the thickness of each etalon resonator are equal so as to have an equal FSR result.

Figure 3:
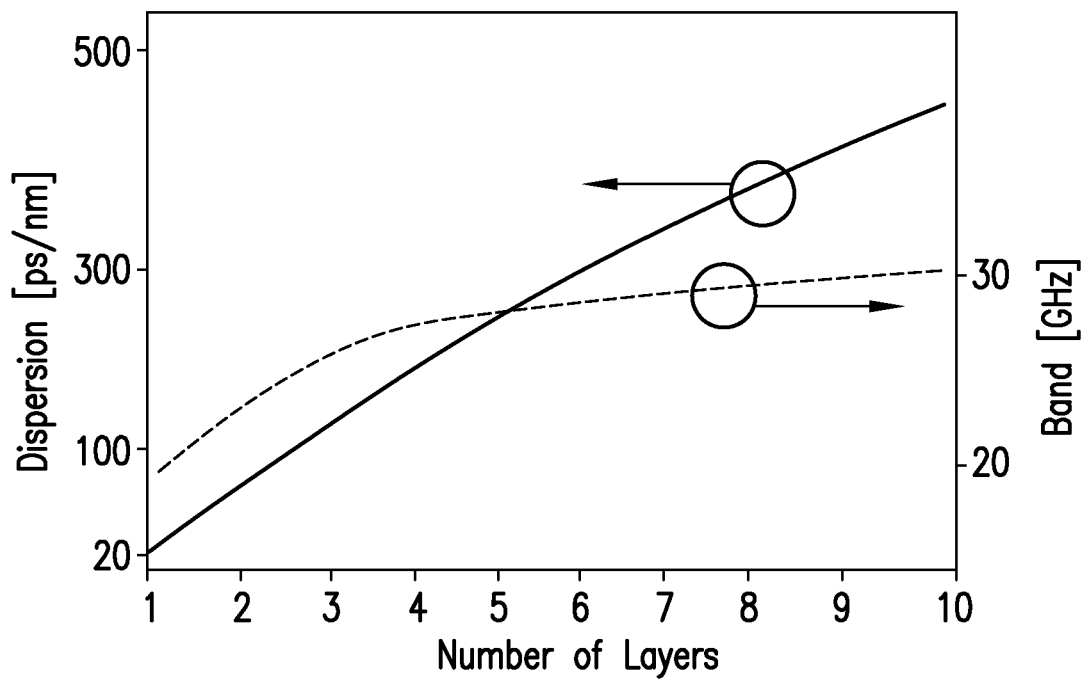
FIG. 3 is a graph showing the amount of dispersion and an operation band with respect to the number of etalon resonator layers of the light dispersion filter illustrated in FIG. 1.

While this embodiment has shown a light dispersion filter composed of six layers of etalon resonators, an increase in the number of layers of etalon resonators can further increase a dispersion compensation value and extend the operating band, as shown in FIG. 3. As described above, an increase in the number of layers of etalon resonators results in reduced transmission power of light due to an increase in the number of reflective planes. Therefore, an optimal number of layers may be selected in consideration of the amount of attenuated transmission power and required dispersive properties.

Figure 4:
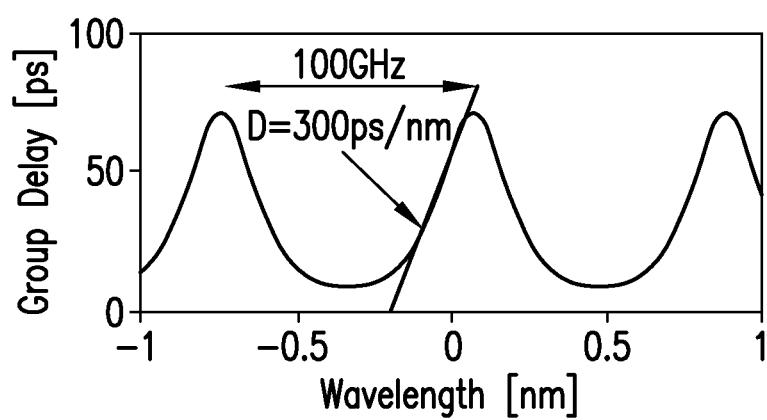
FIG. 4 is a graph showing the group delay characteristic of the light dispersion filter illustrated in FIG. 1.

As shown in FIG. 4, the light dispersion filter of this embodiment has a group delay characteristic with peaks appearing every 100 GHz. The dispersion is derived by differentiating the group delay characteristic of FIG. 4 with respect to the wavelength, and a dispersive property of 300 psec/nm can be accomplished in a range of 30 GHz by utilizing part of the characteristics which rises to the upper right in the graph. Similarly, a dispersive property of −300 psec/nm can be accomplished in a range of 30 GHz by utilizing part of the characteristics which falls to the lower right. This means that the light dispersion filter can compensate for dispersion given within an optical fiber of approximately 20 km in length.

Second Embodiment

Figure 5:
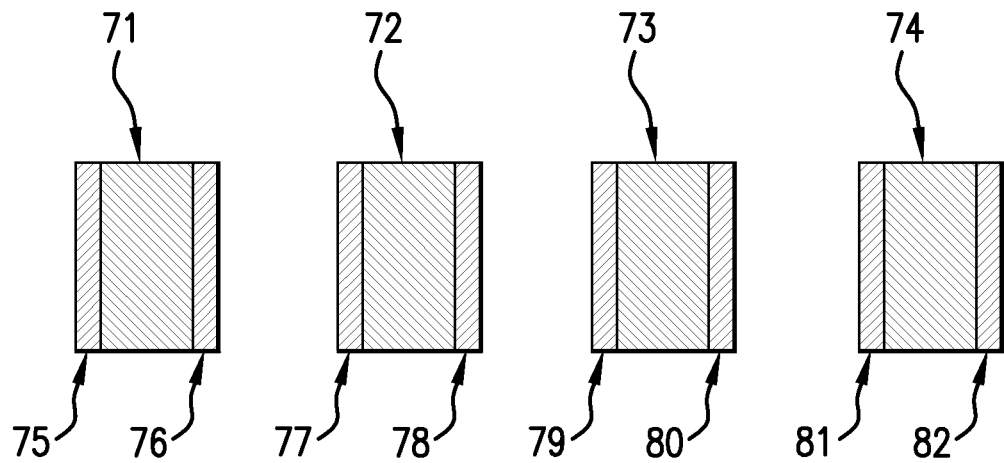
FIG. 5 is a cross-sectional view illustrating the configuration of a second embodiment of the light dispersion filter according to the present invention.

As illustrated in FIG. 5, a light dispersion filter of a second embodiment is composed of a plurality of etalon resonators (four in FIG. 5), which are spaced apart from each other in a series arrangement.

As in the first embodiment, the etalon resonator is composed of substrates (first substrate 71 to fourth substrate 74) made of a dielectric material or semiconductor, and multi-layered films (first multi-layered film 75 to fourth multi-layered film 82) bonded to sandwich the substrates.

The substrate is formed in a thickness of 1 mm such that FSR is 100 GHz, for example, by using general glass which has a refractive index of 1.5. The multi-layered films are composed of laminated $SiO_2$ (silicon dioxide) thin films and TiO (titanium oxide) thin films, in a manner similar to the first embodiment. In this embodiment, the respective etalon resonators are arranged at intervals of 1.5 mm such that FSR is 100 GHz corresponding to the refractive index of air, i.e., 1.0.

Likewise, in the light dispersion filter of this embodiment, in the case of a transmission type, the reflectivities of the multi-layered films of the respective etalon resonators are set such that the reflectivity is the highest on the multi-layered film used by an etalon resonator near the center and is lower toward both ends. For example, the light reflectivity of first multi-layered film 75 and eighth multi-layered film 82 is set to 0%; the light reflectivity of second multi-layered film 76 and seventh multi-layered film 81 to 20%; the light reflectivity of third multi-layered film 77 and sixth multi-layered film 80 to 40%; and the light reflectivity of fourth multi-layered film 78 and fifth multi-layered film 79 to 80%.

On the other hand, in the case of a reflection type, the reflectivity is set to the lowest level (for example, 0%) on the incident plane (first multi-layered film 75 in FIG. 5), and the highest level (for example, 100%) on the last end face (eighth multi-layered film 82 in FIG. 5) on the opposite side to the incident plane.

Likewise, in this embodiment, the values of the reflectivities may be set in any way as long as the relationship of the reflectivities among the respective multi-layered films satisfies the aforementioned conditions, as is the case with the first embodiment.

A dispersion compensation value available by the transmission type light dispersion filter of this embodiment was 400 psec/nm. This means that the light dispersion filter can compensate for dispersion that is given in an optical fiber that is approximately 25 km in length.

Third Embodiment

Figure 6:
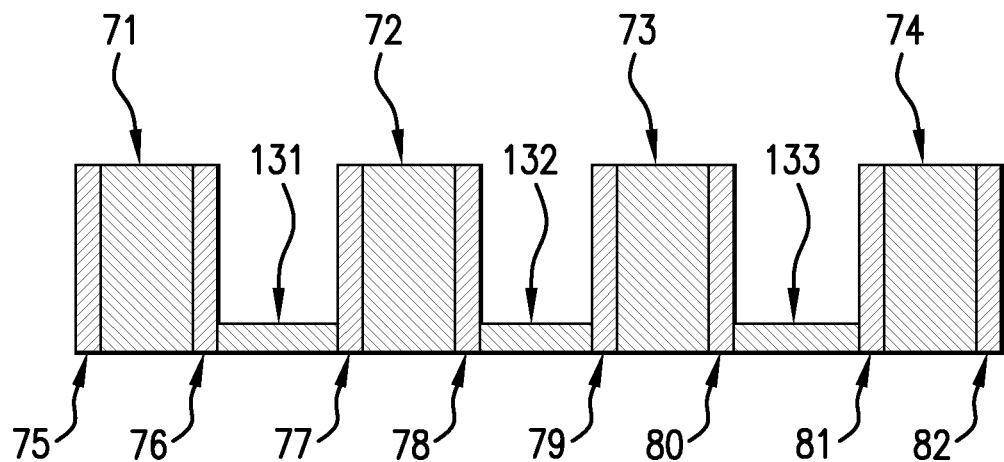
FIG. 6 is a cross-sectional view illustrating the configuration of a third embodiment of the light dispersion filter according to the present invention.

FIG. 6 is a cross-sectional view illustrating the configuration of a third embodiment of the light dispersion filter according to the present invention.

As illustrated in FIG. 6, the light dispersion filter of the third embodiment is similar to the second embodiment in that a plurality of etalon resonators (four in FIG. 6), spaced away from each other, are arranged in series, and gap substrates (first gap substrate 131 to third gap substrate 133) are inserted between the respective etalon resonators for controlling the spacings of air layers. First gap substrate 131 to third gap substrate 133 are formed of a material which is not optically transparent (for example, a metal or the like). The rest of the configuration is similar to the second embodiment, so that description thereon is omitted.

According to the configuration of the light dispersion filter of this embodiment, the distances between the etalon resonators, that constitute air layers, can be readily set using the gap substrates. With such a configuration, when a material having a large thermal expansion coefficient is used for the gap substrates, changing the ambient temperature can easily alter the transmission property and the amount of dispersion.

Fourth Embodiment

Figure 7:
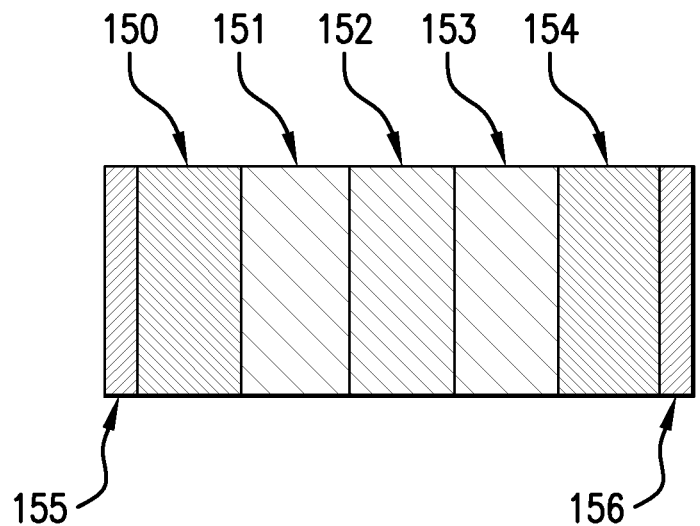
FIG. 7 is a cross-sectional view illustrating the configuration of a fourth embodiment of the light dispersion filter according to the present invention.

As illustrated in FIG. 7, a light dispersion filter of a fourth embodiment is composed of a plurality of laminated etalon resonators (five layers in FIG. 7) in a manner similar to the first embodiment, wherein different materials are used for respective substrates (first substrate 150 to fifth substrate 154 in FIG. 7) which determine the lengths of the associated etalon resonators, and they are directly adhered to each other.

In this embodiment, for example, glass having a refractive index of 1.5 is used for first substrate 150 and fifth substrate 154; ZnO (zinc oxide) having a refractive index of 2.0 is used for second substrate 151 and fourth substrate 153; and TiO (titanium oxide) having a refractive index of 2.8 is used for third substrate 152. Coating films 155, 156, having low reflectivity, may be formed on the surfaces of first substrate 150 and fifth substrate 154 with air between the films.

Generally, reflection of light occurs on a boundary on which the refractive index of material changes. Therefore, when a plurality of substrates, which are different in refractive index from one another, are prepared and adhere to each other as in this embodiment, the need to provide a multi-layered film on the boundary planes between the respective substrates is eliminated. In this event, the reflectivities on the boundary planes of the respective substrates are selected in a manner similar to the first embodiment, such that the reflectivity is the highest on a boundary plane near the center of the light dispersion filter in the direction of thickness of the light dispersion filter, and the reflectivity becomes lower toward both ends. On the other hand, when a reflection type light dispersion filter is formed, the reflectivities of the respective substrates are selected such that the reflectivity becomes gradually higher toward the last end face on the opposite side of the light incident plane.

According to the configuration of the light dispersion filter of this embodiment, the cost of the light dispersion filter can be reduced because of the elimination of the multi-layered films composing the respective etalon resonators and resulting elimination of materials for forming the multi-layered films, as well as the time and facilities required for manufacturing them.

Fifth Embodiment

Figure 8:
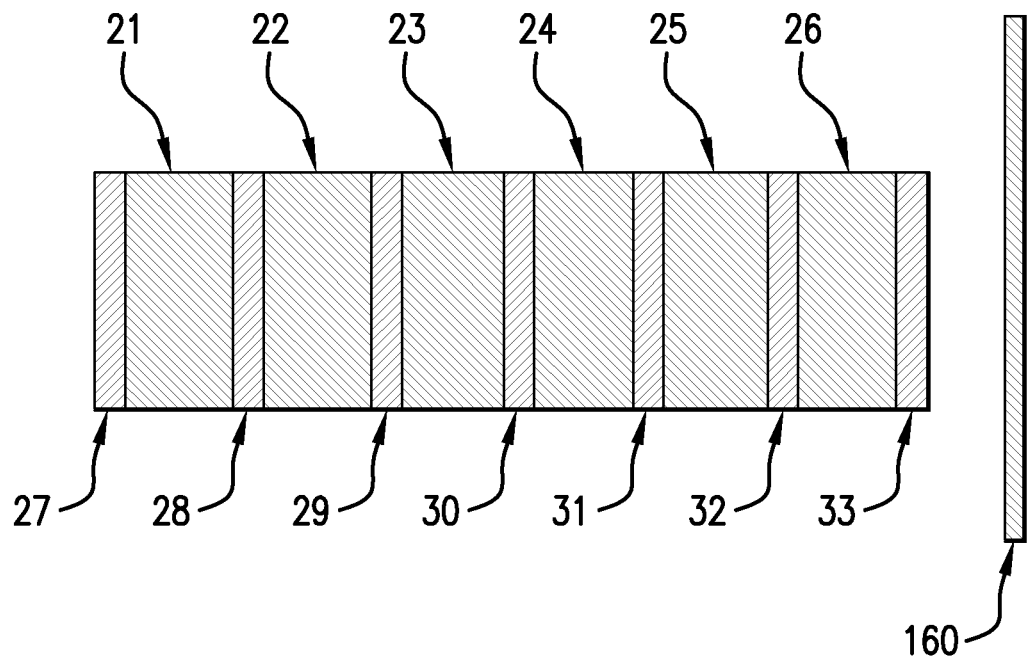
FIG. 8 is a cross-sectional view illustrating the configuration of a fifth embodiment of the light dispersion filter according to the present invention.

As illustrated in FIG. 8, a light dispersion filter of a fifth embodiment comprises additional reflective mirror 160 for completely reflecting light emitted from the light dispersion filter of the first embodiment, in addition to the light dispersion filter of the first embodiment.

Reflective mirror 160 is installed at a position at which the distance to an exit plane multiplied by the value of the refractive index of a material (for example, air) between the exit plane and reflective mirror 160 is equal to one half of the thickness of the substrate of the etalon resonator multiplied by the refractive index.

In such a configuration, an optical signal emitted from the light dispersion filter is transmitted through the light dispersion filter twice. For example, in the light dispersion filter of the first embodiment illustrated in FIG. 1, when the light incident plane and the last end face on the opposite side are made completely reflective, light reflected toward the incident plane interferes with light reflected from the exit plane to reduce the dispersion compensation value in each etalon resonator. By returning light from the exit plane using a reflective mirror, as in this embodiment, a larger dispersion compensation value can be accomplished than by a configuration in which light is completely reflected on the last end face of the etalon resonator.

Sixth Embodiment

Figure 9:
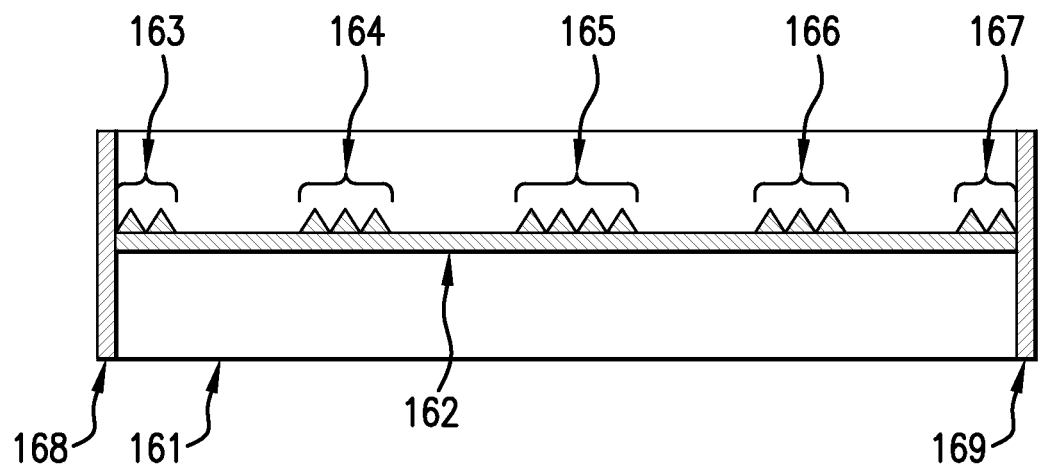
FIG. 9 is a cross-sectional view illustrating the configuration of a sixth embodiment of the light dispersion filter according to the present invention.

As illustrated in FIG. 9, a light dispersion filter of a sixth embodiment employs semiconductors for a substrate of an etalon resonator, and has optical waveguide 162 and an optical amplifier circuit for amplifying an optical signal formed on semiconductor substrate 161.

The optical amplifier circuit comprises a plurality of diffraction gratings (first diffraction grating 163 to fifth diffraction grating 167 in FIG. 9) formed at each predetermined distance on the optical waveguide, for example, utilizing known stimulated emission light. Coating films 168, 169 having a low reflectivity may be formed on the interface of semiconductor substrate 161 with air. Since the diffraction grating exhibits a higher reflectivity because there are a larger number of periods of gratings, a transmission type light dispersion filter is created when the reflection is set highest for a diffraction grating near the center of optical waveguide 162 (third diffraction grating in FIG. 9), and the reflectivity is set to be lower for diffraction gratings that are closer to both end faces. On the other hand, a reflection type light dispersion filter is created when the number of periods is set smallest for first diffraction grating 163 on the light incident plane side, and the number of periods is set largest for fifth diffraction grating 167, and a high reflectivity (for example, 100%) is set for multi-layer films disposed on the incident plane and on the last end on the opposite side.

According to the light dispersion filter of this embodiment, since semiconductors, the refractive index of which is approximately 3.5, are used for the substrate of the etalon resonators, the device length can be formed shorter than the configuration which employs glass having a refractive index of 1.5. Also, since the light dispersion filter has an optical amplifying function, the light dispersion filter can compensate for a coupling loss with an optical fiber.

Seventh Embodiment

A seventh embodiment proposes an optical module which employs a transmission type light dispersion filter from among the light dispersion filters described in the first embodiment to the sixth embodiment.

Figure 10:
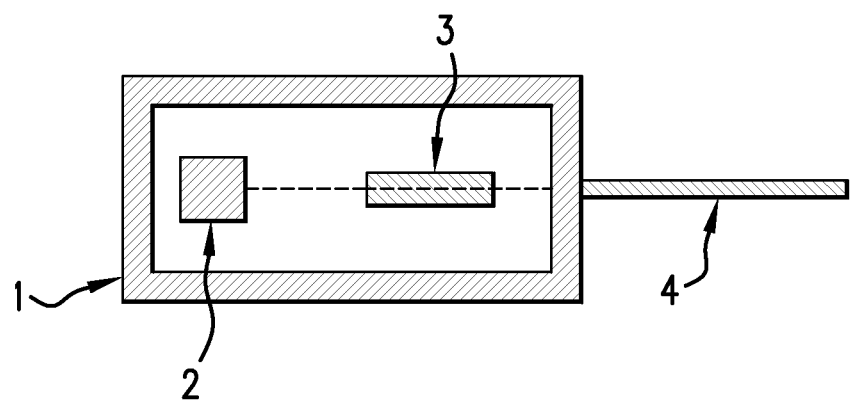
FIG. 10 is a cross-sectional view illustrating an exemplary configuration of an optical module which employs a transmission type light dispersion filter according to the present invention.

As illustrated in FIG. 10, optical module 1 of the seventh embodiment contains, for example, transmission type light dispersion filter 3 described in the first embodiment to the sixth embodiment, and uses light dispersion filter 3 as a dispersion compensator for compensating for dispersion by optical fiber 4.

When the optical module is a transmitter module for transmitting an optical signal, optical module 1 comprises optical active element 2 which serves as a light source, applies light emitted from optical active element 2 with dispersion that is the reverse to the dispersion in optical fiber 4 by using light dispersion filter 3 according to the present invention, and introduces the resulting light into optical fiber 4.

On the other hand, when the optical module is a reception module for receiving an optical signal, optical module 1 comprises optical active element 2 which serves as a light receiving element, applies an optical signal transmitted through optical fiber 4 with dispersion that is the reverse to the dispersion in optical fiber 4 by using light dispersion filter 3 according to the present invention, and introduces the resulting optical signal into optical active element 2.

In the optical module of this embodiment, since light dispersion filter 3 is of the transmission type, light dispersion filter 3 is disposed on the optical axis which connects optical fiber 4 to optical active element 2.

While optical active element 2, which is a light source or a light receiving element, and light dispersion filter 3 are only described in optical module 1 illustrated in FIG. 10, optical module 1 may also comprise a lens for converging light emitted from optical active element 2 onto light dispersion filter 3 and a lens for converging light transmitted through light dispersion filter 3 into the core of optical fiber 4. Alternatively, optical module 1 may comprise a lens for converging light emitted from optical fiber 4 onto light dispersion filter 3, and a lens for converging light transmitted through light dispersion filter 3. Further, an optical isolator may be disposed between the light source and light dispersion filter 3 in order to prevent light reflected from light dispersion filter 3 from returning to the light source to disturb oscillations.

Since the light dispersion filter of this embodiment can be reduced in size as compared with conventional dispersion compensators, the light dispersion filter can be contained, for example, in an optical module which includes a directly modulated semiconductor laser, which serves as a light source, an externally modulated semiconductor laser, and the like. Consequently, since it is possible to provide dispersive properties for compensating for dispersion in an optical fiber within the optical module, an optical-fiber based optical transmission system can extend the transmission distance without providing a large size dispersion compensator external to the optical module.

Eighth Embodiment

An eighth embodiment proposes an optical module which employs a reflection type light dispersion filter from among the light dispersion filters described in the first embodiment to sixth embodiments.

Figure 11:
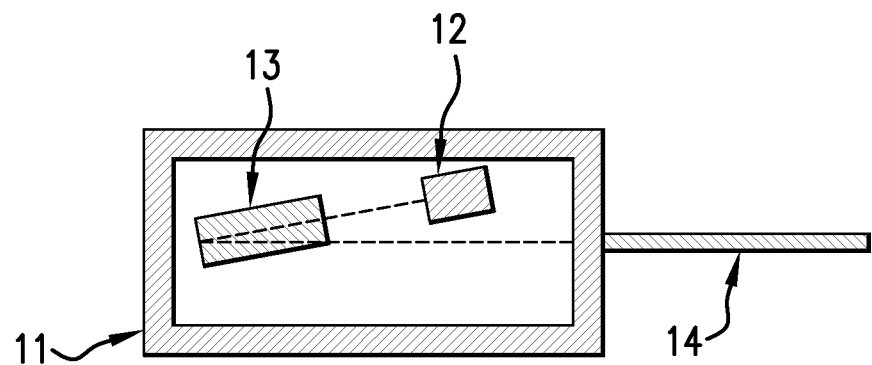
FIG. 11 is a cross-sectional view illustrating an exemplary configuration of an optical module which employs a reflection type light dispersion filter according to the present invention.

As illustrated in FIG. 11, optical module 11 of the eighth embodiment contains, for example, reflection type light dispersion filter 13 described in the first embodiment to sixth embodiment, and uses light dispersion filter 13 as a dispersion compensator for compensating for dispersion by optical filter 14.

When the optical module is a transmitter module for transmitting an optical signal, optical module 11 comprises optical active element 12 which serves as a light source, applies light emitted from optical active element 12 with dispersion that is the reverse to the dispersion in optical fiber 14 by using light dispersion filter 13 according to the present invention, and then introduces the resulting light into optical fiber 14.

On the other hand, when the optical module is a receiver module for receiving an optical signal, optical module 11 comprises optical active element 12 which serves as a light receiving element, applies an optical signal transmitted through optical fiber 14 with dispersion that is the reverse to the dispersion in optical fiber 14 by using light dispersion filter 13 according to the present invention, and then introduces the resulting optical signal into optical active element 12.

In the optical module of this embodiment, since light dispersion filter 13 is of the reflection type, the optical active element is placed at a location deviated from the optical axis which connects optical fiber 14 to light disperse filter 13. The placement of optical active element 12 at such a location eliminates the need for an element (circulator) that will change the optical path of incident light or emitted light, thus making it possible to prevent an increase in the size of the optical module.

The optical module of this embodiment may also comprise a lens for converging light emitted from optical active element 12 onto light dispersion filter 13, and lens for converging light reflected by light dispersion filter 13 into the core of optical fiber 14. Alternatively, the optical module may comprise a lens for converging light emitted from optical fiber 14 onto light dispersion filter 13, and a lens for converging light reflected by light dispersion filter 13 onto optical active element 12. Further, an optical isolator may be disposed between the light source and the light dispersion filter in order to prevent light reflected from light dispersion filter 13 from returning to the light source to disturb oscillations.

As in the seventh embodiment, the optical module of this embodiment can be contained, for example, in an optical module which includes a directly modulated semiconductor laser, which serves as a light source, an externally modulated semiconductor laser, and the like. Consequently, since it is possible to provide dispersive properties for compensating for dispersion in an optical fiber within an optical module, an optical-fiber based optical transmission system can extend the transmission distance without providing a large sized dispersion compensator external to the optical module.

Ninth Embodiment

A ninth embodiment proposes another exemplary configuration of an optical module which employs a reflection type light dispersion filter from among the light dispersion filters described in the first to sixth embodiments.

Figure 12:
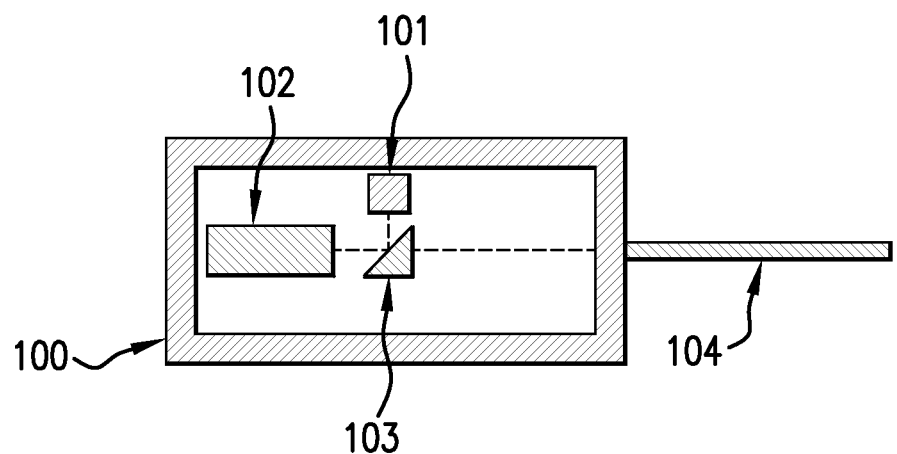
FIG. 12 is a cross-sectional view illustrating another exemplary configuration of an optical module which employs the reflection type light dispersion filter according to the present invention.

As illustrated in FIG. 12, optical module 100 of this embodiment contains, for example, reflection type light dispersion filter 102 described in the first embodiment to sixth embodiment, and uses light dispersion filter 102 as a dispersion compensator for compensating for dispersion due to optical filter 104.

When the optical module is a transmitter module for transmitting an optical signal, optical module 100 comprises optical active element 101 which serves as a light source, applies light emitted from optical active element 101 with dispersion that is the reverse to the dispersion due to optical fiber 104 by using light dispersion filter 102 according to the present invention, and then introduces the resulting light into optical fiber 104.

On the other hand, when the optical module is a receiver module for receiving an optical signal, optical module 100 comprises optical active element 101 which serves as a light receiving element, applies an optical signal transmitted through optical fiber 104 with dispersion that is the reverse to the dispersion in optical fiber 104 by using light dispersion filter 102 according to the present invention, and then introduces the resulting optical signal into optical active element 101.

Further, optical module 100 of this embodiment comprises half mirror 103 disposed on the optical axis which connects optical fiber 104 to light dispersion filter 102, and disposes optical active element 101 on the optical axis of light reflected from half mirror 103.

In such a configuration, since the optical signal passes through half mirror 103 twice, light emitted from optical active element 101 or light received through optical fiber 104 is reduced in power by a factor of four.

However, since half mirror 103 is small enough to be accommodated within optical module 100, unlike a circulator and the like, half mirror 103 can be contained in an optical module which includes a directly modulated semiconductor laser which serves as a light source, an externally modulated semiconductor laser, and the like. Thus, like the seventh and eighth embodiments, since it is possible to provide dispersive properties for compensating for dispersion in an optical fiber within the optical module, an optical-fiber based optical transmission system can extend the transmission distance without providing a large sized dispersion compensator external to the optical module.

Tenth Embodiment

A tenth embodiment is an exemplary modification to the optical module described in the seventh embodiment to ninth embodiment.

Figure 13:
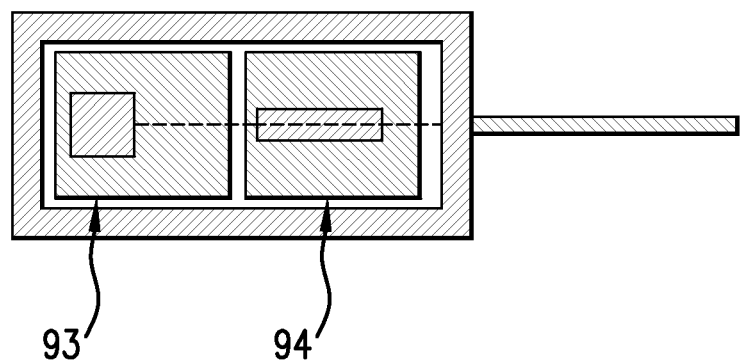
FIG. 13 is a cross-sectional view illustrating a first exemplary modification to an optical module which employs the light dispersion filter according to the present invention.

As illustrated in FIG. 13, an optical module of the tenth embodiment comprises first temperature controller 93 for controlling the temperature of the optical active element; and second temperature controller 94 for controlling the temperature of the light dispersion filter, for example, in the optical module illustrated in the seventh embodiment to ninth embodiment. First temperature controller 93 and second temperature controller 94 each comprise, for example, a heater, not shown; a current source for supplying a current to the heater; a temperature sensor for detecting the temperature of the optical active element or light dispersion filter; and a controller for turning ON/OFF the current supplied to the heater in accordance with a detected value of the temperature sensor.

While FIG. 13 illustrates the configuration of the optical module having a transmission type light dispersion filter illustrated in FIG. 7, given as an example, this embodiment can also be applied to a reflection type light dispersion filter as shown in the eighth and ninth embodiments.

Generally, a temperature changing rate of a wavelength corresponding to an optical active element is approximately 0.08 nm/° C., while a light dispersion filter exhibits a temperature changing rate of 0.01 nm/° C. Therefore, by independently controlling the temperatures of the optical active element and light dispersion filter using first temperature controller 93 and second temperature controller 94, they can each be modified to have desired properties. It should be noted that a change in temperature causes the light dispersion filter to change the amount of dispersion together with the wavelength. Since changing the amount of dispersion depends on the material, the number of layers, and the like used in a particular light dispersion filter, a light dispersion filter may be designed to present optimal values.

Eleventh Embodiment

An eleventh embodiment is another exemplary modification to the optical module described in the seventh embodiment to tenth embodiment.

Figure 14:
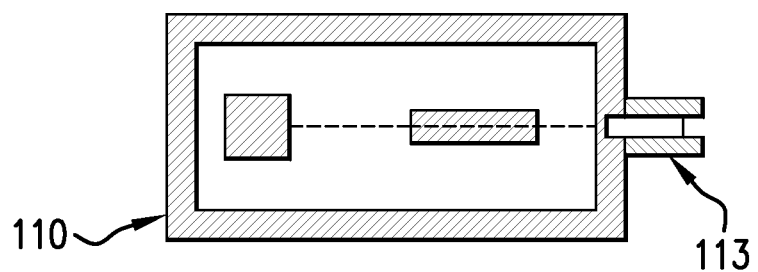
FIG. 14 is a cross-sectional view illustrating a second exemplary modification to an optical module which employs the light dispersion filter according to the present invention.

As illustrated in FIG. 14, the eleventh embodiment is configured such that an optical fiber can be removed from optical module 110 which contains, for example, a light dispersion filter according to the present invention illustrated in the seventh to tenth embodiments. Optical connector 113, for example, is fixed at an optical fiber receptacle. While FIG. 14 illustrates the optical module having the transmission type light dispersion filter described in the seventh embodiment, given as an example, this embodiment can also be applied to a configuration which has a reflection type light dispersion filter as in the eighth and ninth embodiments, and to a configuration having a first and a second temperature controllers as in the tenth embodiment.

In such a configuration, since the cost of optical module 110 can be reduced, an optical module can be provided that is suitable for use in low-end devices.

Twelfth Embodiment

A twelfth embodiment proposes a light dispersion measuring device which applies the light dispersion filter described in the first embodiment to sixth embodiment.

Figure 15:
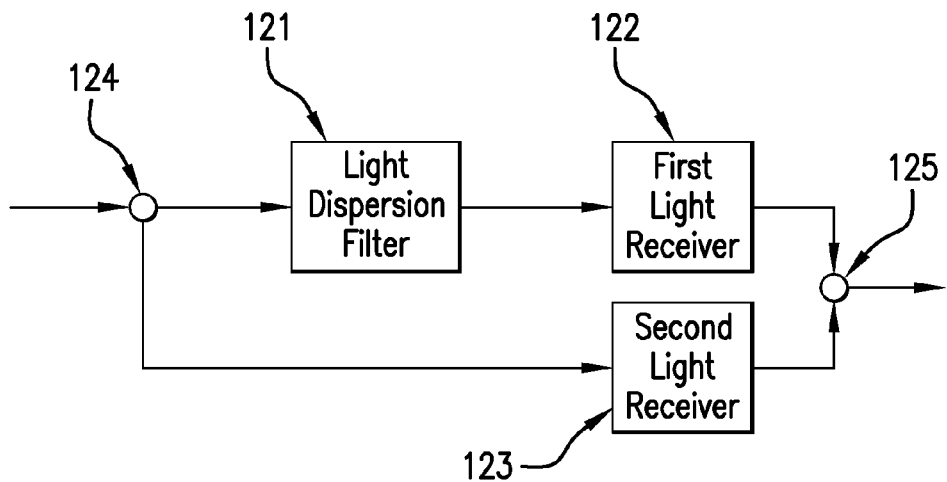
FIG. 15 is a block diagram illustrating an exemplary configuration of a light dispersion measuring device which employs the light dispersion filter according to the present invention.

As illustrated in FIG. 15, the twelfth embodiment is a light dispersion measuring device for measuring the amount of dispersion, for example, by using the light dispersion filter according to the present invention illustrated in the first embodiment to sixth embodiment.

The light dispersion measuring device comprises optical demultiplexer 124 for branching an optical signal; light dispersion filter 121 through which one of the optical signals branched by optical demultiplexer 124 passes; first light receiver 122 for generating an electric signal corresponding to the optical signal which has passed through light dispersion filter 121; second light receiver 123 for generating an electric signal corresponding to another optical signal branched by optical demultiplexer 124; and signal differential circuit 125 for generating the difference between signals generated by first light receiver 122 and second light receiver 123.

In such a configuration, since the output value of signal differential circuit 125 is proportional to a dispersion value by light dispersion filter 121, it is possible to find the amount of dispersion of light dispersion filter 121. Also, when the amount of dispersion from light dispersion filter 121 is known beforehand, the amount of dispersion for an optical signal applied to the light dispersion measuring device can be measured from the difference between the amount of dispersion from light dispersion filter 121 and the amount of dispersion from output value of signal differential circuit 125.

Thirteenth Embodiment

A thirteenth embodiment proposes a communication channel extracting apparatus which applies the light dispersion filter described in the first embodiment to sixth embodiment.

Generally, the frequency interval of each communication channel in a WDM optical communication system is normalized to 50 GHz, 100 GHz, and the like.

Figure 16:
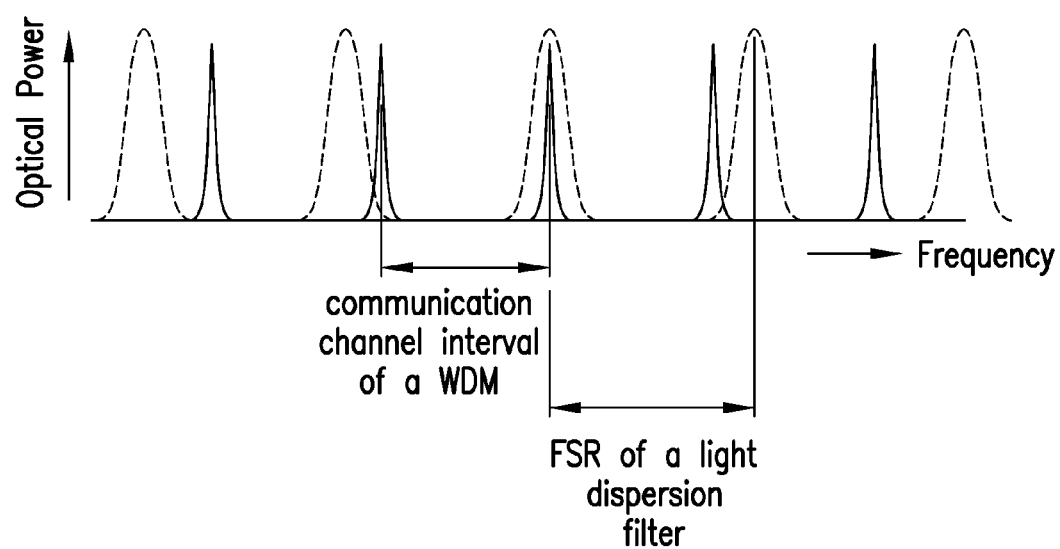
FIG. 16 is a waveform chart showing the effect of a channel extracting method which employs the light dispersion filter according to the present invention.

As described above, the transmission type light dispersion filter according to the present invention has a frequency region for every FSR period in which light is most transmitted through the light dispersion filter. Therefore, as shown in FIG. 16, by setting FSR of the light dispersion filter according to the present invention, illustrated in the first embodiment to six embodiment, for example, to be smaller than the channel interval of a WDM optical communication system, the light dispersion filter can be used as a communication channel extracting apparatus for selecting a communication channel light of the WDM optical communication system, which is transmitted through the light dispersion filter.

Specifically, the FSR of the light dispersion filter is extended by 10 to 20% from the channel interval, for example, such as 60 GHz or 120 GHz. In this event, when the temperature of the light dispersion filter is changed using the temperature controller shown in the tenth embodiment, the light dispersion filter changes in the FSR, so that only an optical signal on a desired communication channel can be extracted from a plurality of communication channels possessed by the WDM optical communication system.

What is claimed is:
1. An optical module comprising:
an optical active element for use in optical communications;
an optical fiber serving as an optical signal transmission medium; and
a reflection type light dispersion filter comprising:
three or more optically transparent layers each having a value equal to the value of a product of a refractive index and a thickness of said optically transparent layer, and transmitting light; and
a plurality of partially reflective layers having predetermined reflectivities, and arranged alternately with said optically transparent layer, wherein the lowest reflectivity is set on an incident plane, and the reflectivity on the respective boundary planes is set to be gradually higher from an incident plane to a last end face; and said reflection type light dispersion filter is disposed on an optical axis connecting said optical active element to said optical fiber for compensating for dispersion in said optical fiber; and said reflection type light dispersion filter comprising a plurality of etalon resonators, and partially reflective layers having predetermined reflectivities, and bonded to two surfaces of the optically transparent layer, respectively, wherein the etalon resonators are arranged in series such that a value of the product of the refractive index of air and an interval of the etalon resonators is a value equal to a value of a product of the refractive index and a thickness of the optically transparent layer.

2. The optical module according to claim 1, wherein said optical active element is a light source for emitting an optical signal.

3. The optical module according to claim 1, wherein said optical active element is a light receiving element for receiving an optical signal.

4. The optical module according to claim 1, further comprising:
   a first temperature controller for controlling the temperature of said optical active element; and
   a second temperature controller for controlling the temperature of said light dispersion filter.

* * * * *